United States Patent [19]

Engeler et al.

[11] 3,762,966

[45] Oct. 2, 1973

[54] METHOD OF FABRICATING HIGH EMITTER EFFICIENCY SEMICONDUCTOR DEVICE WITH LOW BASE RESISTANCE BY SELECTIVE DIFFUSION OF BASE IMPURITIES

[75] Inventors: William E. Engeler, Scotia; Marvin Garfinkel, Schenectady, both of N.Y.

[73] Assignee: General Electric Company, Schenectady, N.Y.

[22] Filed: Feb. 13, 1970

[21] Appl. No.: 14,903

Related U.S. Application Data

[62] Division of Ser. No. 760,526, Sept. 18, 1968, Pat. No. 3,577,045.

[52] U.S. Cl. .................... 148/175, 29/576, 29/578, 148/190, 148/191, 317/235 R

[51] Int. Cl. .................... H01l 7/36, H01l 7/44

[58] Field of Search .................... 148/1.5, 175, 177, 148/178, 190, 191; 156/17; 317/234, 235; 29/576, 578

[56] References Cited

UNITED STATES PATENTS

| | | | |
|---|---|---|---|
| 3,160,539 | 12/1964 | Hall et al. | 156/17 |
| 3,309,244 | 3/1967 | Ackerman et al. | 148/178 |
| 3,347,720 | 10/1967 | Bryan et al. | 148/187 |
| 3,370,995 | 2/1968 | Lowery et al. | 148/175 |
| 3,384,518 | 5/1968 | Shoda et al. | 148/177 |
| 3,440,500 | 4/1969 | Coppen | 317/235 |
| 3,511,724 | 5/1970 | Ohta | 148/190 X |
| 3,535,775 | 10/1970 | Garfinkel et al. | 156/17 X |
| 3,551,220 | 12/1970 | Meer et al. | 148/175 |

FOREIGN PATENTS OR APPLICATIONS

| | | | |
|---|---|---|---|
| 1,045,429 | 10/1966 | Great Britain | 317/235 |

OTHER PUBLICATIONS

Agusta et al. "Monolithic Integrated . . . .Base Regions" IBM Tech. Discl. Bull., Vol 9, No. 5, October 1966, pp 546–547

*Primary Examiner*—L. Dewayne Rutledge
*Assistant Examiner*—W. G. Saba
*Attorney*—Richard R. Brainard, Marvin Snyder, Paul A. Frank, Frank L. Neuhauser, Oscar B. Waddell and Melvin M. Goldenberg

[57] ABSTRACT

A transistor, such as NPN type, for example, is fabricated by first diffusing a heavily doped P-type base contact region into an N-type semiconductor layer epitaxially grown on a heavily doped N-type semiconductor wafer. Holes are etched through the base contact region into the N-type layer and strongly N-type semiconductor material containing both N-type impurities and faster diffusing P-type impurities is epitaxially grown so as to fill the holes. The wafer is then heated to diffuse the P-type impurities so as to form a base region of controlled thickness, simultaneously forming emitter-base and base-collector junctions. Emitter contact is made by contacting the material epitaxially grown in the holes. Other type semiconductor devices, such as semiconductor controlled rectifiers, may also be fabricated in this manner.

8 Claims, 10 Drawing Figures

Inventors:
William E. Engeler,
Marvin Garfinkel,
by John F. Ahern
Their Attorney.

Inventors:
William E. Engeler,
Marvin Garfinkel,
by John F. Ahern
Their Attorney.

METHOD OF FABRICATING HIGH EMITTER EFFICIENCY SEMICONDUCTOR DEVICE WITH LOW BASE RESISTANCE BY SELECTIVE DIFFUSION OF BASE IMPURITIES

This application is a division of our application Ser. No. 760,526, filed Sept. 18, 1968, now Pat. No. 3,577,045, entitled HIGH EMITTER EFFICIENCY SEMICONDUCTOR DEVICE WITH LOW BASE RESISTANCE AND METHOD OF FABRICATING SAME BY SELECTIVE DIFFUSION OF BASE IMPURITIES.

This invention relates to semiconductor devices, and more particularly to diffused transistors wherein base region and base contact region resistivity are independent of each other and wherein emitter-base and base-collector junctions are formed simultaneously in a single step.

In fabricating bipolar transistors by diffusion of conductivity type determining impurities into a semiconductor, formation of the base has heretofore required two separate diffusion steps. In the first step, the base conductivity type determining impurities are diffused into the semiconductor and define, at their furthermost location, one of the base junctions. In the second step, opposite conductivity type determining impurities are diffused into the previously diffused region so as to form the emitter and define, at their furthermost location, the other base junction. The two boundaries are thus located independently of each other, rendering precise control of the base width rather difficult to achieve. Furthermore, the base diffusion must be such as to optimize between the conflicting requirements of high emitter efficiency (which means that a large fraction of emitter current results in injection of minority carriers into the base) and low base resistance.

The present invention, in addition to other enumerated advantages, permits formation of the base region in a single diffusion step, thus making it much easier to maintain precise control over the base thickness or width. This also avoids those difficulties associated with the anomalous emitter diffusion (the so-called "emitter dip") in which a diffusion of impurities of one conductivity determining type into a portion of a region previously diffused with impurities of the opposite conductivity determining type causes the previously diffused impurities to diffuse deeper into the semiconductor beneath the area in which the second diffusion occurs. A detailed discussion of the anomalous emitter diffusion is found on pages 61–64 of *Physics and Technology of Semiconductor Devices* by A.S. Grove, Wiley, 1967.

In W.E. Engeler application Ser. No. 760,613, filed concurrently herewith, now Pat. No. 3,558,375 and assigned to the instant assignee, a method of making variable capacity diodes, including formation of a highly doped contact region by diffusing impurities from solid semiconductor material containing a plurality of impurities having different diffusion rates, is described and claimed.

In the present invention, the base region of the transistor is formed by diffusing impurities from solid semiconductor material containing a plurality of impurities having different diffusion rates. Moreover, the base and base contact regions of the transistor are produced independently of each other, permitting greater latitude in design. Transistors fabricated according to the instant invention are capable of operating at high frequencies. Furthermore, when the ultimate source of dopant for both emitter and base is the bulk semiconductor used as the source in the epitaxial deposition step, better control over impurity concentrations in the emitter and base regions can be maintained than if conventional vapor source diffusion processes are employed. Additionally, the invention employs an oxide coating on the semiconductor in order to pattern the doped semiconductor acting as a solid diffusion source, rather than to act as a mask against diffusion. This is especially advantageous since, as is well known, silicon dioxide does not mask against all dopants. Nevertheless, such dopants may be used in practicing the instant invention.

Accordingly, one object of the invention is to provide a method of fabricating a high frequency, bipolar trsnsistor with precise control over width of the transistor base region.

Another object is to provide a method of fabricating semiconductor devices so as to facilitate precise control over concentrations of impurities in the emitter and base regions thereof.

Another object is to provide a method of fabricating semiconductor devices by diffusing impurities into a semiconductor without need for an oxide diffusion mask thereon.

Another object is to provide a method of fabricating transistors wherein the base contact region and active region of the base are independently formed.

Another object is to provide a method of fabricating semiconductor devices by diffusion without encountering any anomalous emitter diffusion.

Another object is to provide a transistor wherein base resistance is minimized and emitter efficiency is maximized, without any need for interdigitated contacts.

Another object is to provide a transistor wherein base conductivity is independent of base contact resistance.

Briefly, in accordance with a preferred embodiment of the invention, a process for fabricating semiconductor devices comprises the steps of forming a heavily doped contact region of one type conductivity semiconductor material in a layer of opposite type conductivity semiconductor material and etching holes through the contact region into the layer of opposite type conductivity semiconductor material. Semiconductor material heavily doped with impurities of the opposite conductivity determining type but also containing impurities of the one conductivity determining type is then expitaxially grown in the holes. The impurities of the one conductivity determining type are faster diffusing than the impurities of the opposite conductivity determining type so that by heating the semiconductor material, a predetermined amount of diffusion of impurities occurs from the epitaxially grown semiconductor material into the layer of opposite type conductivity material.

In accordance with another preferred embodiment of the invention, an improved semiconductor junction transistor comprises a collector region doped with impurities to produce one type conductivity which is adjacent a base contact region of opposite type conductivity. At least one emitter region extends through the base contact region and is substantially uniformly doped throughout its extent predominantly with a concentration of impurities producing the one type conductivity but also containing impurities of the opposite conductivity determining type at a lower concentration. A base region of the opposite type conductivity is situated between the emitter and collector regions and merges with the base contact region. The base region contains, at its interface with the emitter region, a lower concentration of impurities of the opposite conductivity determining type than the base contact region.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

DESCRIPTION OF TYPICAL EMBODIMENTS

Figure 1:
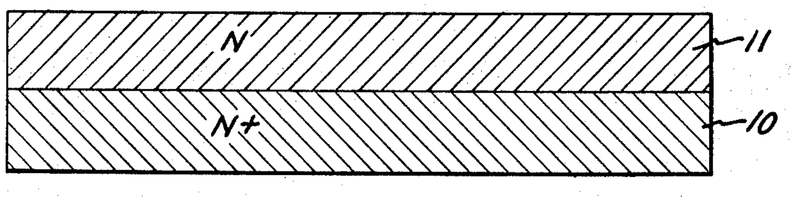
FIGS. 1–9 illustrate sequential steps performed in practicing the invention.

In FIG. 1, a wafer 10 of semiconductor material such as silicon is illustrated having a layer 11 of the semiconductor material epitaxially grown thereon in conventional fashion. Wafer 10 is heavily doped with impurities of one conductivity determining type, and epitaxial layer 11 is doped with similar ocnductivity determining impurities, but at a lower concentration. For illustrative purposes, it will be assumed that wafer 10 and layer 11 are doped with donor impurities such as phosphorus, arsenic or antimony, and therefore are illustrated as being of $N^+$ and N conductivity respectively. Doping levels range from $10^{19}$ to $10^{21}$ atoms per cubic centimeter for wafer 10 and from $10^{15}$ to $10^{17}$ atoms per cubic centimeter for layer 11. Typical doping levels may be $10^{20}$ atoms per cubic centimeter for wafer 10 and $5\times10^{15}$ atoms per cubic centimeter for layer 11. Thickness of layer 11 is typically in the order of 10 microns. It should be noted that, in the alternative, wafer 10 and layer 11 may be of $P^+$ and P conductivity respectively, with wafer 10 and layer 11 being doped with acceptor impurities such as boron or gallium.

Figure 2:
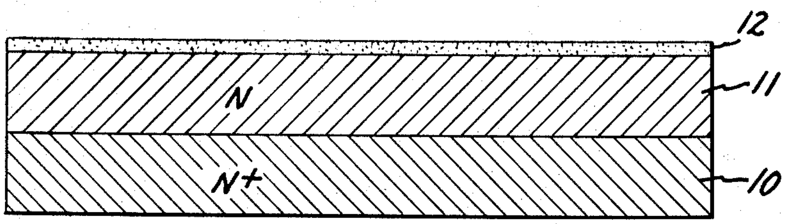
Figure 3:
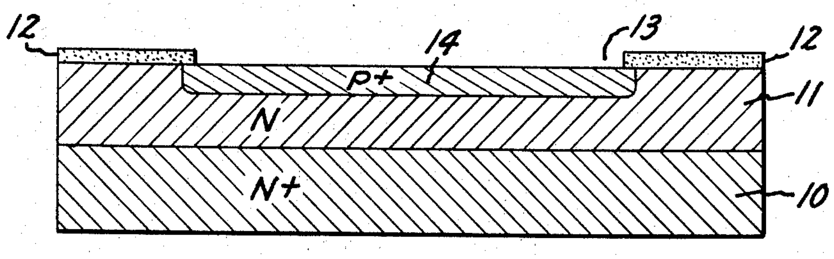

A silicon oxide layer 12, illustrated in FIG. 2, is next grown on layer 11, in conventional fashion, to a thickness typically in the range of 1,000 or 2,000 angstroms up to about 1 micron. In the alternative, oxide layer 12 may be deposited thereon. An opening 13 is then cut in oxide layer 12 by employment of conventional photoresist techniques and a base contact region 14 is diffused into epitaxially grown layer 11, resulting in the structure illustrated in FIG. 3. In the alternative, region 14 may be grown epitaxially atop layer 11. Base contact region 14, which is typically about 1 micron in thickness, is heavily doped with impurities of opposite conductivity determining type to those employed in regions 10 and 11, and therefore is indicated as being of $P^+$ conductivity. A typical acceptor impurity useful in forming base contact region 14 is boron in a concentration ranging from $10^{18}$—$10^{20}$ atoms per cubic centimerer, typically in a concentration of $10^{20}$ atoms per cubic centimeter.

Figure 4:
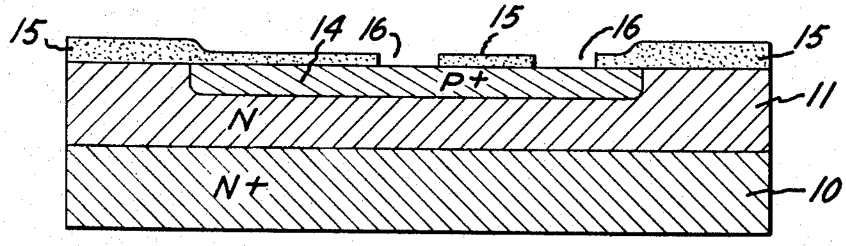

If desired, the wafer at this stage may be etched for a short time in buffered hydrofluoric acid in order to remove excess oxide containing boron. The uppermost surface of the device is then reoxidized by thermal oxidation to form an oxide layer 15, and one or any desired number of openings 16, such as shown in FIG. 4, are cut in oxide layer 15 by employment of conventional photoresist techniques. These openings, which are to define the emitter regions of the device, can be located anywhere within region 14 and require no further critical registration, as will be seen, infra. As a result, these openings may be fabricated of smaller sizes than in cases where critical registration is required. This is especially advantageous in fabricating high frequency and high power devices where a minimum base impedance is desired. In the extreme, the holes may be formed by fission track etching in the manner described and claimed in the copending application of M. Garfinkel, et al. Ser. No. 691,484, filed Dec. 18, 1967, now U.S. Pat. No. 3,535,775 and assigned to the instant assignee. In this event, the fission track etched holes are situated in random locations within the base contact region.

Complete removal of the photoresist after cutting windows 16 is achieved conventionally by employment of hot sulfuric acid followed by a water rinse. The exposed surface of base contact region 14 is then cleaned with hot nitric acid, followed by a water rinse to remove any residue. This, in turn, may be followed by a short etch in buffered hydrofluoric acid in order to remove any small traces of oxide remaining on the exposed surfaces of base contact region 14.

Figure 5:
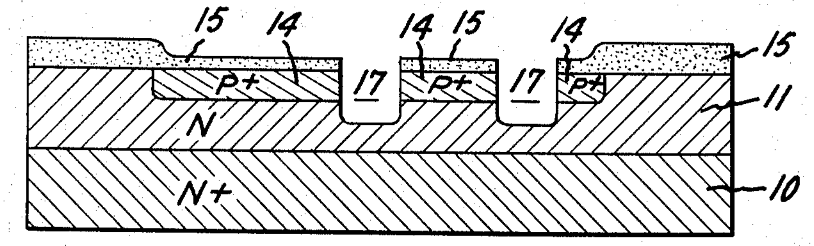

A vapor etch, conveniently chlorine or HCl, is next employed in a gas-tight system to cut holes 17 through the openings in oxide layer 15 which extend down through base contact region 14 into epitaxial layer 11, as illustrated in FIG. 5. Holes 17 must not be etched beyond the extent of epitaxial layer 11. Accordingly, the depth of each of holes 17 is no greater than about 5 microns.

Figure 6:
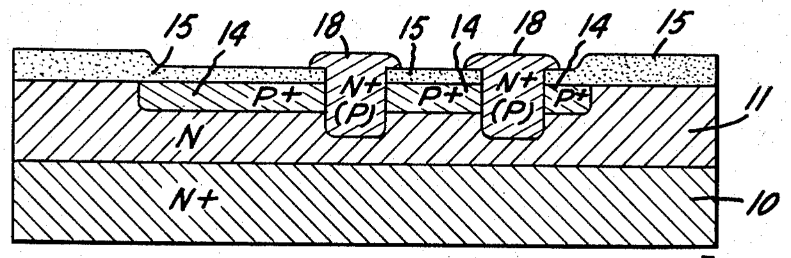

Thereafter, conveniently keeping the device in the same system in which the vapor etch of holes 17 was performed and pumping out the residual chlorine or HCl, holes 17 are filled with epitaxially grown material 18, resulting in a structure such as illustrated in FIG. 6. The epitaxially grown material is heavily doped with impurities of the conductivity determining type used in epitaxial layer 11 and hence is indicated as being of $N^+$ conductivity. However, epitaxially grown material 18 is compensated since it contains compensating impurities, here P-type as indicated by (P) in FIG. 6.

Material 18 is epitaxially grown to an extent which permits the material to protrude above the level of and overlap onto, oxide layer 15. Examples of processes by which regions 18 may be grown epitaxially are described and claimed in W.C. Dash et al. U.S. Pat. No. 3,316,130, issued Apr. 25, 1967, and assigned to the instant assignee. As described in the aforementioned Dash et al. patent, for example, this epitaxial deposition is performed by providing a source of silicon juxtaposed in closely spaced relation with holes 17, illustrated in FIG. 5, heating the source and the device, with the device being heated to a higher temperature than the source, and introducing an atmosphere of iodine vapor into the system so as to cause silicon from the source to be epitaxially grown on the semiconductor material of the device through holes 17. In this process, the iodine vapor pressure is typically 2 millimeters of mercury and the source temperature is typically 1,000°C, while the source contains both N-type and P-type impurities in a concentration to ensure that epitaxially grown regions 18 contain the desired concentrations of impurities. Such concentrations in regions 18 might be, for example, in the range of about $10^{19}$ to $5\times10^{21}$ atoms per cubic centimeter of donor impurities and $10^{16}$-$10^{19}$ atoms per cubic centimeter of acceptor impurities. Typical doping concentrations in regions 18 may be about $10^{20}$ atoms per cubic centimeter of donor impurities and $10^{17}$ atoms per cubic centimeter of acceptor impurities.

It should be noted that epitaxially grown regions 18 may be produced, alternatively, by forming on the structure illustrated in FIG. 5 a first silicon nitride layer atop oxide layer 15. Thereafter, the silicon semiconductor material is epitaxially deposited on the surface of the wafer to form regions 18 by hydrogen reduction of $SiCl_4$ at a temperature in the range of 950°C–1,300°C. Doping of material 18 may be accomplished, as is well-known, by incorporating into the transport gas stream vapors such as $PH_3$, $AsCl_3$, $B_2H_6$ or $SbCl_5$, for example, together with the $SiCl_4$. Any unwanted portions of this material may then be etched away after first patterning an etch mask of a second silicon nitride layer atop the desired portions of this material. In this event, regions 18 may be integrally joined, if desired. The second silicon nitride layer formed atop oxide layer 15 is then removed.

In the structure illustrated in FIG. 6, epitaxially grown regions 18 contain acceptor impurities of a type which diffuse faster than the donor impurities. For example, the acceptor impurities may comprise gallium or boron while the donor impurities may comprise antimony or arsenic. Operable combinations of various chemical element dopants for fabricating regions of silicon transistors are set forth in Table I below.

TABLE I.—DOPANTS FOR SILICON TRANSISTORS

| Transistor type | Emitter dopant | Base dopant | Base contact dopant |
|---|---|---|---|
| NPN | As | B | B |
| NPN | As | B | Ga |
| NPN | As | Ga | B |
| NPN | As | Ga | Ga |
| NPN | As | Al | B |
| NPN | As | Al | Ga |
| NPN | Sb | B | B |
| NPN | Sb | B | Ga |
| NPN | Sb | Ga | B |
| NPN | Sb | Ga | Ga |
| NPN | Sb | Al | B |
| NPN | Sb | Al | Ga |
| NPN | P | Al | B |
| NPN | P | Al | Ga |
| PNP | B | P | P |
| PNP | B | P | Sb |
| PNP | B | P | As |
| PNP | Ga | P | P |
| PNP | Ga | P | Sb |
| PNP | Ga | P | As |

Figure 7:
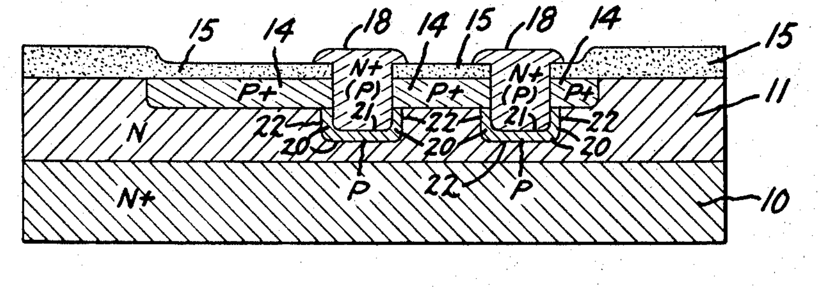

The entire structure is then heated to a temperature in the range of 900°–1,200°C for sufficient time such that the more rapidly diffusing impurities, the acceptor impurities in this case, form base regions 20, shown in FIG. 7, of substantially constant thickness in the order of about 1 micron. Base regions 20 are consequently doped to P type conductivity, representing an impurity concentration in the range of $10^{16}$–$10^{19}$ atoms per cubic centimeter, typically about $10^{17}$ atoms per cubic centimeter. Thus, the emitterbase and base-collector junctions 21 and 22 respectively are simultaneously formed by but a single diffusion step and base regions 20 automatically follow the pattern of the emitter and are automatically contacted by the previously diffused base contact region 14. Of course, if the transistor to be fabricated is to be a PNP transistor, regions 18 are grown containing donor impurities of a type which diffuse faster than the acceptor impurities also contained therein. In such instance, the donor impurities may comprise phosphorous while the acceptor impurities may comprise boron or gallium. In either case, the ratio of emitter thickness to base thickness is at least 3.

Figure 8:
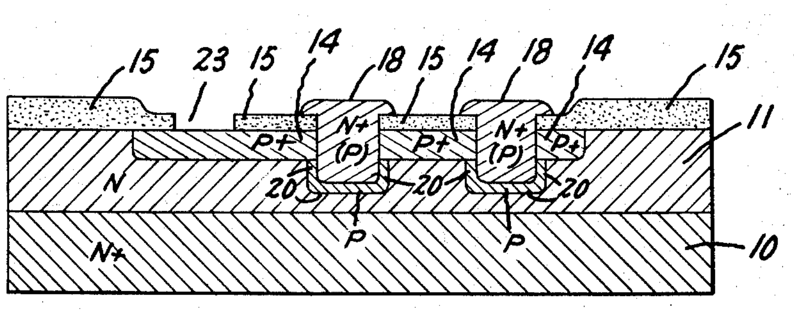
Figure 9:
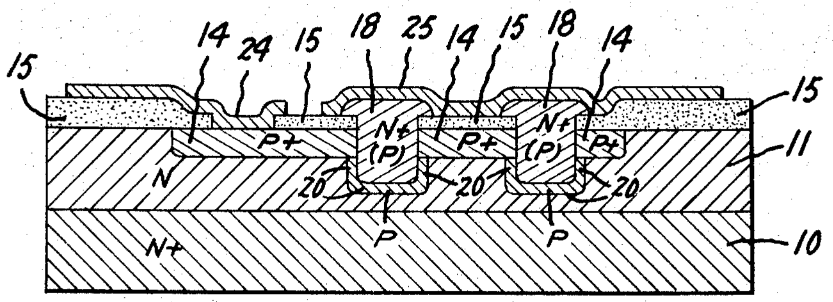

Ohmic connection to the base contact region is next made by cutting an opening 23 in oxide layer 15 by employment of conventional photoresist techniques so as to expose a portion of the surface of base contact region 14, as illustrated in FIG. 8. Thereafter, a layer of metal, such as aluminum, is deposited over the surface of the structure shown in FIG. 8, such as by evaporation. This layer of metal is then separated into a base conductor 24 and an emitter conductor 25, as illustrated in FIG. 9, by employment of conventional photoresist techniques, using an etchant such as 76 percent phosphoric acid, 6 percent acetic acid, 3 percent nitric acid and 15 percent water, in the case of aluminum. In this manner, conductor 25 connects all, or any desired number of emitter regions 18 together. Several such connections may be utilized, if desired, for fabricating multi-emitter devices. Each emitter region is isolated from each other, except for the narrow base contact region. This enables each emitter to operate substantially independent of each other.

The structure illustrated in FIG. 9 is fabricated in the foregoing manner so as to make contact to the base layers without encountering any critical contact registration problems. The base contact region makes contact to all the base regions in the device and is, furthermore, highly conductive. Thus any need for employment of interdigitated contacts, such as are commonly employed in high frequency transistor structures is eliminated. Moreover, because of the high conductivity of the base contact region, the base region can be fabricated without an unduly high conductivity. Hence emitter efficiency, which varies essentially as the ratio of emitter conductivity to base conductivity, can be maintained relatively high. This facilitates fabrication of transistors having a plurality of emitter regions, with their well-known high frequency and high power advantages, without any difficult photolithographic mask registration problems.

Figure 10:
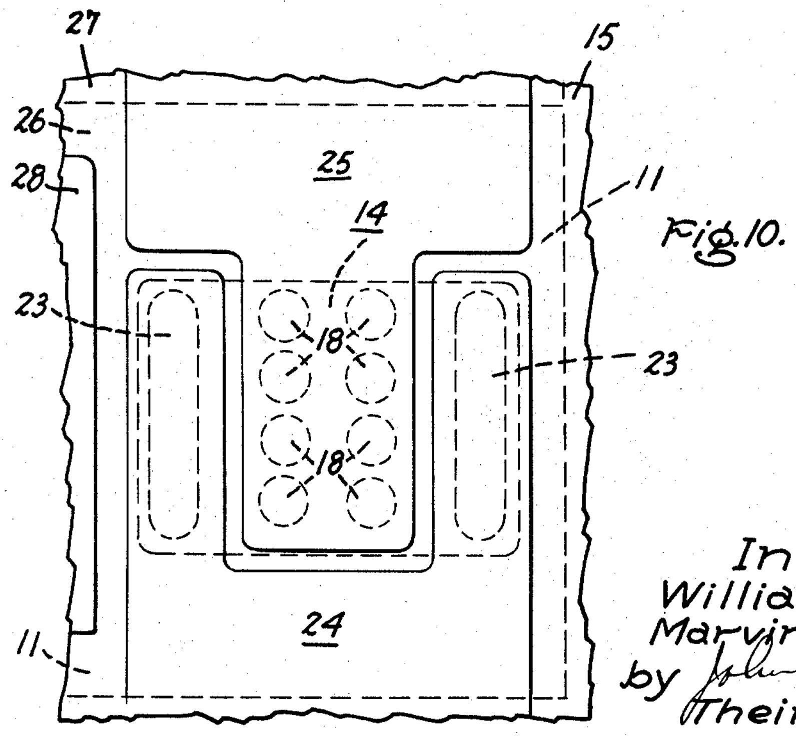
FIG. 10 is a plan view of a transistor constructed in accordance with the teachings of the instant invention.

FIG. 10 is a plan view of a transistor fabricated according to the foregoing description, which may be formed as a discrete device or as part of an integrated circuit. Thus, emitter conductor 25 is illustrated as being deposited over epitaxially grown regions 18 so as to make contact with each of regions 18, while base conductor 24 is deposited over openings 23 in oxide layer 15 on either side of emitter contact 25. The transistor of this embodiment is fabricated, as described in the foregoing manner, on an N-type section 11 of semiconductor 26 which is isolated by a P-type region 27 from the remaining portion of the integrated circuit. Collector contact to layer 11 is supplied by conductor 28.

It should be noted that other semiconductor devices such as a semiconductor controlled rectifier may also be fabricated in the preceding manner. In such event, the structure of FIG. 9 is fabricated so that region 10 is of $P^+$ conductivity and layer 11 is of higher resistivity and larger dimensions than employed for a transistor. Regions 18 function as the cathode or emitter of the device and regions 20 function as the base region of the device. However, region 14 functions as the gate contact region with conductor 24 acting as the gate. In a semiconductor controlled rectifier fabricated in this manner, all emitter regions are switched on simultaneously so that the entire device is switched on at the same time, resulting in a uniformly triggered device. Chances of burnout are thus drastically reduced.

The foregoing describes a method of fabricating a high frequency, bipolar transistor with precise control over width of the base region. Emitter-base and base-collector junctions are formed simultaneously in but a single diffusion step, avoiding any anomalous emitter diffusion, and contact to each of these transistor regions is made without any critical registration problems. Moreover, there is no need for interdigitated contacts to individual base regions of the transistor thus formed since the base region and base contact region conductivities are independent of each other, permitting minimization of base resistance and maximization of emitter efficiency. The method also permits fabrication of semiconductor devices so as to facilitate maintenance of precise control over impurity concentrations in the emitter and base regions of the devices. By this method, semiconductor devices can be fabricated by diffusing impurities into a semiconductor without need for an oxide diffusion mask thereon.

The following examples are set forth to further explicate practice of this invention. These examples include specific values of the parameters involved so that the invention may be practiced by those skilled in the art. However, these examples are provided for the purpose of illustration only, and are not to be construed in a limiting sense.

EXAMPLE 1

A PNP transistor is fabricated as follows. A silicon wafer containing a concentration of $10^{20}$ boron atoms boron atoms/cc is momentarily etched in HCl gas. A 10 micron thick layer is next epitaxially grown on the [111] surface of the wafer by conventional hydrogen reduction of $SiCl_4$ in an atmosphere containing a slight (in the order of parts per ten billion) boron concentration in the form of $B_2H_6$ so that a uniformly doped layer of single crystal silicon containing $3\times10^{15}$ boron atoms/cc is formed. This process takes place at a substrate temperature of 1,100°C. A dry thermal oxide of 2,700A thickness is next grown onto the wafer by heating the wafer in an atmosphere of dry oxygen for 10 hours at a temperature of 1,000°C. This is followed by an anneal at 1,000°C in an atmosphere of dry helium for a period of 2 hours. The oxide layer is next coated with a layer of photoresist material such as KMER, available from Eastman Kodak Company, Rochester, N. Y. The desired pattern defining the location, size and number of base contact locations is produced by selectively exposing the photoresist film to ultraviolet light in the conventional manner. This pattern is in the form of a plurality of squares, each 4 mils on a side, repeated every 15 mils. The unpolymerized photoresist material is next developed away in accordance with procedures furnished by the photoresist manufacturer and the film is baked for 1 hour at 200°C. The pattern is transferred to the silicon dioxide layer by etching for 3 minutes in buffered hydrofluoric acid comprising 10 parts 40 percent $NH_4F$ and one part 48 percent HF. The silicon material in the locations of what will be the base contact regions are thus exposed in the plurality of squares pattern. The resist film is then removed. $N^+$ base contact regions $1\mu$ deep are next diffused into the wafer by heating the wafer to 1,000°C for 114 minutes in a flow composed of 1,000 cc/min nitrogen, 1 cc/min oxygen and 40 cc/min $PCl_3$ diluted 1,900 parts per million in nitrogen. The surface concentration is $1\times10^{19}$ phosphorous atoms/cc. A $SiO_2$ layer 1,000A thick is next formed over the base contact region by oxidizing the wafer in dry oxygen for 1 hour at 1,000°C. The wafer is next coated with a layer of photoresist material, as above. The pattern defining the size, number, and configuration of the emitters and bases of the transistors is next produced by selectively exposing the photoresist film to ultraviolet light. As above, the unexposed portions of the film are washed away, the film hardened, the unprotected areas of $SiO_2$ etched away, and the photoresist film removed. This pattern is an array of 8 circular holes in the $SiO_2$, each having a diameter of 8 microns, arranged in two rows of 4. The distance between centers is 20 microns. The wafer is then placed in a reaction chamber and momentarily brought to a temperature of 1,200°C in a vacuum in order to remove any residual oxide on the silicon surface which is to experience epitaxial growth. The wafer is then heated to 700°C, and is etched lightly with chlorine gas to remove 2 microns of silicon unprotected by the oxide layer. By closely spaced iodine transport of silicon as described in W.C. Dash et al. U.S. Pat. No. 3,316,130 issued Apr. 25, 1967, an epitaxial layer 6 microns in thickness is selectively grown in and through the 8 micron holes etched in the silicon. The epitaxial layer is doped to a concentration of approximately $5\times10^{20}$ boron atoms/cc and $1\times10^{18}$ phosphorus atoms/cc. The wafer is maintained at 1,050°C for 1.5 minutes in close proximity (1 mm separation) to a silicon source wafer maintained at 1,000°C, at an iodine pressure of approximately 2 mm Hg. The wafer is next heated to 1,050°C for 30 minutes in an inert atmosphere. This results in diffusion of both boron and phosphorus from the epitaxially grown material into the lightly doped P-type collector region to the depth of $0.6\mu$ and $1.6\mu$ for boron and phosphorus, respectively. In this manner, a 1 micron wide N-type base region is formed which has uniform width and which automatically makes electrical contact with the previously formed base contact region. Contact apertures are next conventionally etched with buffered HF in a portion of the oxide layer covering the base contact region. The wafer is next conventionally metallized with aluminum so as to make electrically separate contact to the base contact region and the emitter. In this case the emitter comprises the $8\mu$ epitaxially grown $P^+$ regions which are electrically joined in parallel by the aluminum metallization. The wafer is next scribed and cleaved into dice and the dice are conventionally mounted upon headers with electrical connection conventionally made by nail-head bonding.

EXAMPLE 2

An NPN transistor is fabricated as follows. A silicon wafer containing a concentration of $10^{20}$ boron atoms boron atoms/cc is momentarily etched in HCl gas. A 10 micron thick layer is next epitaxially grown on the [111] surface of the wafer by conventional hydrogen reduction of $SiCl_4$ in an atmosphere containing a slight (in the order of parts per billion) phosphorus concentration in the form of $PH_3$ so that a uniformly doped layer of single crystal silicon containing $3\times10^{15}$ phosphorus atoms/cc is formed. This process takes place at a substrate temperature of 1,100°C. A dry thermal oxide of 2,700A thickness is next grown onto the wafer by heating the wafer in an atmosphere of dry oxygen for 10 hours at a temperature of 1,000°C. This is followed by an anneal at 1,000°C in an atmosphere of dry helium for a period of 2 hours. The oxide layer is next coated with a layer of photoresist material such as KMER, available from Eastman Kodak Company, Rochester, N. Y. The desired pattern defining the location, size and number of base contact locations is produced by selectively exposing the photoresist film to ultraviolet light in the conventional manner. This pattern is in the form of a plurality of squares, each 4 mils on a side, repeated every 15 mils. The unpolymerized photoresist material is next developed away in accordance with procedures furnished by the photoresist manufacturer and the film is baked for 1 hour at 200°C. The pattern is transferred to the silicon dioxide layer by etching for 3 minutes in buffered hydrofluoric acid comprising 10 parts 40 percent $NH_4F$ and one part 48 percent HF. The silicon material in the locations of what will be the base contact regions are thus exposed in the plurality of squares pattern. The resist film is then removed. $P^+$ base contact regions 1 micron deep are next diffused into the wafer by heating the wafer to 1,120°C for 20 minutes in a flow composed of 1,845 cc/min nitrogen, 0.55 cc/min oxygen, 0.77 cc/min hydrogen and 15 cc/min $BCl_3$ diluted 2,500 parts per million in nitrogen. The surface concentration is $2\times10^{19}$ atoms/cc of boron. A $SiO_2$ layer 1,000A thick is next formed over the base contact region by oxidizing the wafer in dry oxygen for 1 hour at 1,000°C. A 1,000A layer of silicon nitride is next deposited atop the oxide layer in a furance at 850°C containing an atmosphere of $SiH_4$ and ammonia. A layer of molybdenum is next conventionally triode sputtered onto the nitride layer atop the wafer which is maintained at a temperature of 500°C, to a thickness of 2,000A. The wafer is then cooled to room temperature and the molybdenum layer is covered with a layer of photoresist material, as above. The pattern defining the size, number, and configuration of the emitters and bases of the transistors is next produced by selectively exposing the photoresist film to ultraviolet light. As above, the unexposed portions of the film are washed away, and the film is hardened. The molybdenum film is then etched for one-half minute in a molybdenum etchant comprising 76 percent orthophosphoric acid, 6 percent glacial acetic acid, 3 percent nitric acid and 15 percent water. The wafer is next immersed in a bath of hot (180°C) phosphoric acid for 15 minutes to transfer the etched pattern to the silicon nitride layer. The molybdenum is thereafter removed by etching in the above molybdenum etchant, and the pattern is transferred to the $SiO_2$ layer by etching for 1.5 minutes in buffered HF. This pattern is the same as in Example 1. The wafer is then placed in a reaction chamber, heated to 700°C and is etched with chlorine gas to remove 2 microns of silicon in those regions not protected by the composite silicon dioxide, silicon nitride layer. An epitaxial layer is now grown in the reaction vessel by hydrogen reduction of $SiCl_4$ in the presence of $B_2H_6$ and $AsCl_3$ at a temperature of 1,000°C for 45 minutes, so as to grow 6 microns of silicon containing $5\times10^{17}$ boron atoms/cc and $5\times10^{20}$ arsenic atoms/cc. A second layer of silicon nitride is deposited over the device at 850°C. This second silicon nitride layer is patterned in the same manner as the first silicon nitride layer. Silicon which may have been deposited over the initial, lower silicon nitride layer is then removed by employing an etchant comprising 160 cc acetic acid, 0.5 gm iodine, 280 cc nitric acid and 50 cc 48 percent HF. The upper and lower silicon nitride layers thus limit etching of the device to the unwanted silicon which overlaps the lower silicon nitride layer. Any remaining silicon nitride atop the second epitaxially grown layer of silicon is then etched away in hot (180°C) phosphoric acid. The wafer is next heated to 1,100°C for 60 minutes in an inert atmosphere. This results in the diffusion of both boron and arsenic from the epitaxially grown material into the lightly doped N-type collector region to the depth of $0.5\mu$ and $1.5\mu$ for arsenic and boron, respectively. In this manner, 1 micron wide P-type base regions are formed which have uniform width and which automatically make electrical contact with the previously formed base contact regions, respectively. Apertures are next opened to the base contact regions and the wafer is metallized and cleaved into dice which are then mounted on headers.

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

We claim:

1. A method of fabricating a semiconductor device comprising the steps of:

forming a contact region of heavily doped one type conductivity semiconductor material in a major surface of opposite type conductivity semiconductor material;

etching at least one hole through said contact region into said opposite type conductivity semiconductor material;

epitaxially growing in each said hole additional semiconductor material doped with impurities of the opposite conductivity determining type in a first predetermined concentration but also containing impurities of the one conductivity determining type in a second predetermined concentration less than said first predetermined concentration so as to form a composite structure, each said hole being filled with said epitaxially grown material at least up to the level of one said major surface to provide substantial engagement with said contact region, said impurities of the one conductivity determining type being faster diffusing than said impurities of the opposite conductivity determining type; and heating the composite structure thus formed so as to allow a predetermined amount of diffusion of said impurities of the one conductivity determining type from said epitaxially grown semiconductor material into said opposite type conductivity semiconductor material to alter the conductivity type of a portion thereof adjacent said epitaxially grown semiconductor material.

2. The method of claim 1 wherein said semiconductor material comprises silicon, said impurities of the one conductivity determining type comprise one of the group consisting of gallium, aluminum and boron, and said impurities of the opposite conductivity determining type comprise one of the group consisting of antimony, phosphorous and arsenic.

3. The method of claim 1 wherein said step of forming a base contact region comprises diffusing impurities of the one conductivity determining type in a specific concentration into said material of opposite type conductivity.

4. The method of claim 1 wherein said step of forming a contact region comprises epitaxially depositing said one type conductivity semiconductor material atop said major surface of said opposite type conductivity semiconductor material.

5. The method of claim 1 wherein the step of etching at least one hole through said contact region comprises the steps of covering the surface of said contact region with an insulating coating, forming at least one opening in said insulating coating, and etching each said hole in the area exposed by each said opening in said insulating coating.

6. The method of claim 5 wherein said step of covering the surface of said contact region comprises thermally oxidizing the surface of said contact region.

7. The method of claim 5 including the additional steps of exposing a portion of the surface of said contact region, forming a first metallic coating in electrical contact with the exposed portion of the surface of said contact region, and forming a second metallic coating in electrical contact with said semiconductor material epitaxially grown through each said hole, said first and second metallic coatings being electrically isolated from each other.

8. The method of claim 1 wherein said semiconductor material comprises silicon, said impurities of the one conductivity determining type comprise phosphorous, antimony, and arsenic, and said impurities of the opposite conductivity determining type comprise one of the group consisting of gallium and boron.

* * * * *